US010677612B2

(12) United States Patent
Nikic

(10) Patent No.: US 10,677,612 B2
(45) Date of Patent: Jun. 9, 2020

(54) LARGE SURFACE MAGNETIC FIELD SENSOR ARRAY

(71) Applicant: The Boeing Company, Chicago, IL (US)

(72) Inventor: Dejan Nikic, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 259 days.

(21) Appl. No.: 15/671,004

(22) Filed: Aug. 7, 2017

(65) Prior Publication Data

US 2019/0041236 A1 Feb. 7, 2019

(51) Int. Cl.
| | |
|---|---|
| *G01D 5/14* | (2006.01) |
| *G01R 33/07* | (2006.01) |
| *G01R 33/36* | (2006.01) |
| *G01R 33/00* | (2006.01) |
| *G01B 7/02* | (2006.01) |
| *G01R 19/08* | (2006.01) |
| *G01R 15/18* | (2006.01) |
| *G01R 15/20* | (2006.01) |

(52) U.S. Cl.
CPC ............. *G01D 5/145* (2013.01); *G01B 7/023* (2013.01); *G01R 15/181* (2013.01); *G01R 15/207* (2013.01); *G01R 19/08* (2013.01); *G01R 33/0005* (2013.01); *G01R 33/0029* (2013.01); *G01R 33/075* (2013.01); *G01R 33/077* (2013.01); *G01R 33/3642* (2013.01)

(58) Field of Classification Search
CPC .. G01D 5/145; G01R 33/3642; G01R 33/077; G01R 33/075; G01R 33/0029; G01R 33/0005; G01B 7/023

USPC ..... 324/76.11, 96, 200, 207.13–207.19, 239, 324/241–247, 500, 529, 530
See application file for complete search history.

(56) References Cited

U.S. PATENT DOCUMENTS

| | | | |
|---|---|---|---|
| 2006/0066304 A1 | 3/2006 | Schill, Jr. et al. | |
| 2008/0024118 A1* | 1/2008 | Kahlman | G01N 27/745 324/204 |
| 2011/0018532 A1* | 1/2011 | Florescu | G01N 33/54326 324/251 |
| 2016/0077027 A1 | 3/2016 | Sweers et al. | |

OTHER PUBLICATIONS

Berkery, John W. "Current Sheet Mass Leakage in a Pulsed Plasma Accelerator", PhD Thesis, Princeton University, 2005.
Everson,, E.T.,e t al., "Design, construction, and calibratio of a three-axis, high-frequency magnetic probe (B-dot probe) as a diagnostic for exploding plasmas," Review of Scientific Instruments, 80, 11305 (2009).

* cited by examiner

*Primary Examiner* — Melissa J Koval
*Assistant Examiner* — Trung Nguyen
(74) *Attorney, Agent, or Firm* — Coats & Bennett, PLLC

(57) ABSTRACT

A plurality of magnetic field sensors, for example arranged in an array, is operative to measure changes in magnetic field strength proximate the surface(s) of a test structure. The test structure may approximate the geometry of an airplane fuselage, wing, or the like. An electric current is applied to the test structure, and the magnetic field sensors sense changes in a magnetic field caused by the current. A corresponding plurality of integrators convert the sensor outputs to magnetic field strength values. From the plurality of magnetic field strength values and corresponding sensor locations, a current density over the target surface is inferred.

20 Claims, 8 Drawing Sheets

LARGE SURFACE MAGNETIC FIELD SENSOR ARRAY

FIELD OF INVENTION

The present invention relates generally to current sensing, and in particular for a method and apparatus for inferring current density over a large surface.

BACKGROUND

Lightning strikes on aircraft are known to occur. Conventionally, the fuselage and wings of airplanes were made of lightweight metal such as aluminum. Electrical current from lightning generally travels along the outer skin of such airplanes, causing little damage. Conventional airplane metal exteriors exhibit isotropic conductivity, and can carry even large currents in a well-defined and well-understood manner. Testing for lightning survivability is relatively straightforward. The current density over the exterior surface of an airplane in a lightning strike is usually highly uniform. Hence, a local current measured at one spot may reasonably be considered representative of what is occurring over the entire airplane.

Many modern airplanes are built of composite materials rather than metal. Composites may be lighter and more flexible than metal, with higher elasticity and the ability to embed electronics, such as antennas, into the composite material. Composite airframes are often fabricated in layers. In particular, they may include conductive layers, such as those constructed of carbon fiber, separated by dielectric layers, such as those constructed of various resins. The conductive layers generally exhibit non-isotropic conductivity, such as along the direction of the constituent fibers. Consequently, current density over a composite airframe in a lightning strike is usually non-homogenous, and may be quite complex. This greatly complicates lightning strike research and testing, as it may be difficult to predict or measure current density over the large surface areas.

The Background section of this document is provided to place aspects of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of aspects of the invention or to delineate the scope of the invention. The sole purpose of this summary is to present some concepts disclosed herein in a simplified form as a prelude to the more detailed description that is presented later.

According to one or more aspects described and claimed herein, a plurality of magnetic field sensors, such as arranged in an array, is operative to measure changes in magnetic field strength proximate the surface(s) of a test structure. The test structure may approximate the geometry of an airplane fuselage, wing, or the like. An electric current is applied to the test structure, and the magnetic field sensors sense changes in a magnetic field caused by the current. A corresponding plurality of integrators converts the sensor outputs to magnetic field strength values. From the plurality of magnetic field strength values and corresponding sensor locations, a current density over the target surface is inferred.

One aspect relates to a method of analyzing an electrical current over a target surface. A plurality of magnetic field sensors is provided. Each sensor is operatively connected to an integrator. The plurality of magnetic field sensors is positioned proximate the target surface. An electrical current is applied to the target surface. A change in magnetic field strength is sensed at one or more sensor locations. The changes in magnetic field strength are integrated to derive a magnetic field strength value at each sensor location. A current density over the target surface is inferred from the plurality of magnetic field strength values and corresponding sensor locations.

Another aspect relates to an apparatus operative to analyze an electrical current over a target surface. The apparatus includes a plurality of magnetic field sensors positioned at known locations in an array. Each magnetic field sensor is operative to sense a change in magnetic field strength. An integrator is operatively connected to each magnetic field sensor and is operative to derive a magnetic field strength value by integrating the connected sensor's output. A data processing system is operative to receive an output of each integrator, and is further operative to infer a current density over the target surface from the plurality of magnetic field strength values and corresponding sensor locations.

Yet another aspect relates to a non-transitory computer-readable medium. The medium stores program instructions operative to cause a data processing system to process magnetic field sensor array outputs to analyze an electrical current over a target surface. The instructions cause the data processing system to sense a change in magnetic field strength at one or more sensor locations on the array, when the magnetic field sensor array is positioned proximate the target surface and an electrical current is applied to the target surface; integrate the changes in magnetic field strength to derive a magnetic field strength value at each sensor location; infer a local current value from each magnetic field strength value; and infer a current density over the target surface by mapping the local current values to the target surface using the corresponding sensor locations.

BRIEF DESCRIPTION OF THE DRAWINGS

The present invention will now be described more fully hereinafter with reference to the accompanying drawings, in which aspects of the invention are shown. However, this invention should not be construed as limited to the aspects set forth herein. Rather, these aspects are provided so that this disclosure will be thorough and complete, and will fully convey the scope of the invention to those skilled in the art. Like numbers refer to like elements throughout.

DETAILED DESCRIPTION

Figure 1:
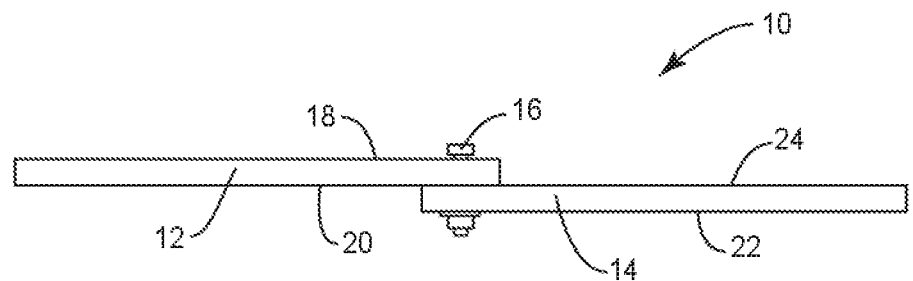
FIG. 1 is a section view of a test structure.

For simplicity and illustrative purposes, the present invention is described by referring mainly to an exemplary aspect thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Current density in layered composite materials, including airframes, is non-uniform, and driven by geometry, conductivity, and current magnitude. Small currents may be confined to fiber layers, where the current has a strong preference along the direction of the fibers. Large current may cause destruction by bleeding through layers, as high voltage breaks down the dielectric barriers of insulating resin layers. Consequently, the current density—that is, the concentration of current across the surface of a material—is complex, non-uniform, and difficult to measure.

Apart from the unique challenges of measuring current density in a composite material, the direct measurement of very large currents itself is usually not possible, due to inductance effects and high energy levels, which can damage measurement equipment. Accordingly, high currents are often inferred by measuring the magnetic fields they generate.

One current-sensing circuit known in the art (for example, known for measuring current in plasma experiments) is a coil of wire, known in the art as a B-Dot sensor. The name derives from Faraday's equation, which relates voltage induced in a coil to a changing magnetic flux through the coil as $V \sim -Bdt = -\dot{B}$. The voltage may be induced in a stationary coil by a changing magnetic field or the start-up/shut-down transients of a static magnetic field. Alternatively, a voltage is induced in coil by moving it through a static magnetic field. The B-dot sensor alone registers only the rate of change of the magnetic field; this value must be integrated over time to quantitatively measure the field, from which the current generating the magnetic field may be inferred.

More precisely, Faraday's law states:

$$V = -\frac{d\Phi_B}{dt} = -aN\frac{dB_\perp}{dt}$$

where $\Phi_B$ is the magnetic flux through a coil, $B_\perp$ is the perpendicular component of the constant magnetic field strength over the area of the coil, a is the coil area, N is the number of turns in the coil, and V is the induced voltage. The magnetic field itself can be determined by integrating the B-dot signal in real-time by an analog integrator circuit, or numerically after digitization of the signal. A high quality integrator circuit is required for accurate measurement. A coil may be constructed by winding magnet wire, or other insulated wire, around a form. Alternatively, the coil may be manufactured by printing, such as additive manufacturing (also known as 3-D printing), as traces on a printed circuit board, or as a conductive path in an Integrated Circuit (IC).

Although the use of B-dot sensors and concomitant integrator circuits is known to measure magnetic fields, e.g., in studying plasma phenomena (of which lightning strikes are one example), they typically measure current from a single point source. Magnetic sensors have not been used to measure and study current density across a 2-D or 3-D surface.

FIG. 1 is a side section view of a test structure 10, referred to as a two fastener lap joint, commonly used in Electro-Magnetic Environment (EME) testing. The test structure 10 comprises two sheets 12, 14 of composite material, bolted together with fasteners 16. The sheet 12 has a front side 18, facing up in FIG. 1, and a bag side 20 facing down. The front side 18 corresponds to the finished, outwardly-facing surface of a composite material on an airplane fuselage or wing. The bag side 20, so named due to an inflatable bladder used in the fabrication process, corresponds to an interior-facing side. On the other sheet 14, the front side 22 faces down, and the bag side 24 faces up. Both sheets 12, 14 are coated in a non-conductive primer to protect the composite material. At their junction, this primer presents a discontinuity, which may impact the current density across the test structure 10 when a high current is applied, to simulate a lightning strike.

High voltage is applied to one end of the test structure 10, such as sheet 12, while the other end, such as sheet 14, is grounded. This allows current to flow across sheet 12, through the fasteners 16, and subsequently across sheet 14. It is usually assumed that there would be a 50-50 split in current going through the two fasteners 16. However, some damage assessments imply that this might not be correct. Actually measuring high currents through the fasteners 16 is problematic, and in any event would not yield information about the current density across the sheets 12, 14.

Figure 2:
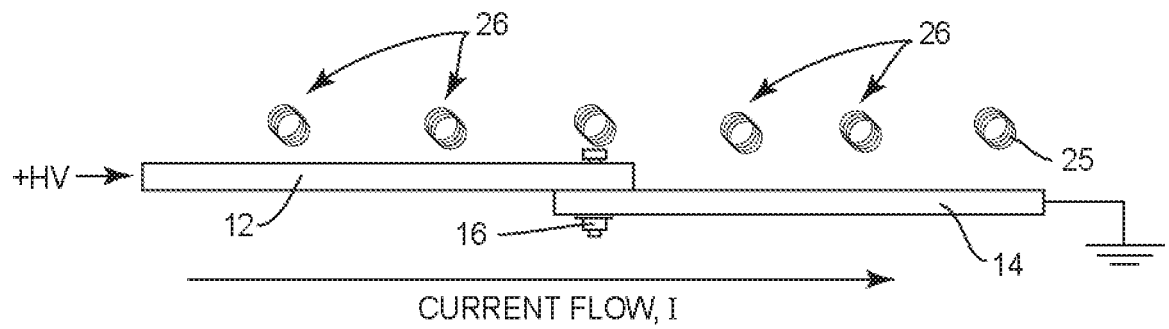
FIG. 2 is a section view of magnetic field sensors proximate the test structure.

FIG. 2 depicts the test structure 10 with high voltage (HV) and ground applied, indicating the general direction of current flow I. According to aspects described and claimed herein a plurality of magnetic field sensors 26, such as B-dot sensors are positioned proximate to a target surface, such as the front side surface 18 of sheet 12 and bag side surface 24 of sheet 14. Each sensor comprises a coil of wire 25, and is operatively connected to an integrator (not shown), the outputs of which are collected by a data processing system (not shown). As indicated, an electrical current is applied to the target surfaces 18, 24 of the test structure 10. The magnetic field sensors 26 sense a change in magnetic field strength at each respective sensor location 27, as the current I ramps up, and possibly changes over the test structure 10, e.g., in response to temperature changes, voltage-induced damage, or the like. The detected changes in magnetic field strength are integrated to derive a magnetic field strength value at each sensor location 27. A current density over the target surfaces of the test structure 10 is then inferred from the plurality of magnetic field strength values and corresponding sensor locations 27.

Figure 3:
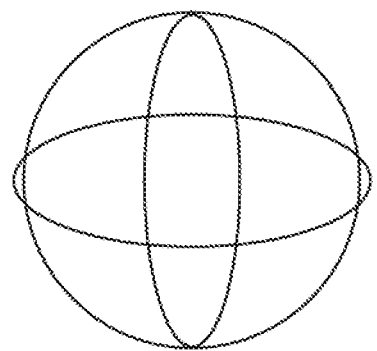
FIG. 3 is a perspective view of coils in three orthogonal directions.

FIG. 2 depicts the B-dot coils 26 as being aligned in only a single direction. That is, only one coil 26 is depicted at each sensor location 27, and all of the coils 26 have the same orientation. Each coil 26 is operative to detect only changes in a magnetic field whose flux lines are perpendicular to the coil area—that is, the flux lines are parallel with a longitudinal axis extending down the centerline of the coil 26. For a more complete spatial view of the magnetic field, compound sensors 26 may be constructed, each having multiple coils with different orientations. For example, three coils, arranged about three orthogonal axes, as depicted in FIG. 3, would measure magnetic flux in all three spatial directions (e.g., x, y, and z directions). A composite flux may be obtained as the vector sum of the three coil 26 outputs. Note that a single coil measures flux in both directions perpendicular to its cross-sectional area—flux in one direction will induce a positive voltage, and flux in the opposite direction will induce a negative voltage.

Figure 4:
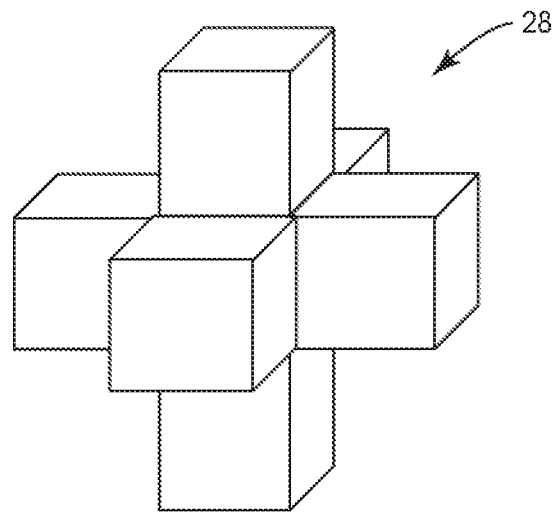
FIG. 4 is a perspective view of a mounting structure for magnetic field sensors.

FIG. 4 depicts a six-pole mounting structure 28 on which six B-dot coils 26 may be wound. In one aspect, providing two coils 26 in each orientation allows a more robust signal to be obtained as a common mode of a differential pair. In this case, the two coils 26 in each of the three axes (i.e., directions) should be wound in opposite directions. If the six-pole structure 28 is formed from a nonferrous, dielectric material, it may be left in place to provide structural support for the coils 26, without impacting the magnetic flux sensing operation. If at least three coils 26 are mounted at each structure 28, e.g., in x, y, and z directions, a resultant magnetic field may be resolved by the vector sum of the magnetic field components detected by each coil 26 (and associated integrator circuit).

Figure 5:
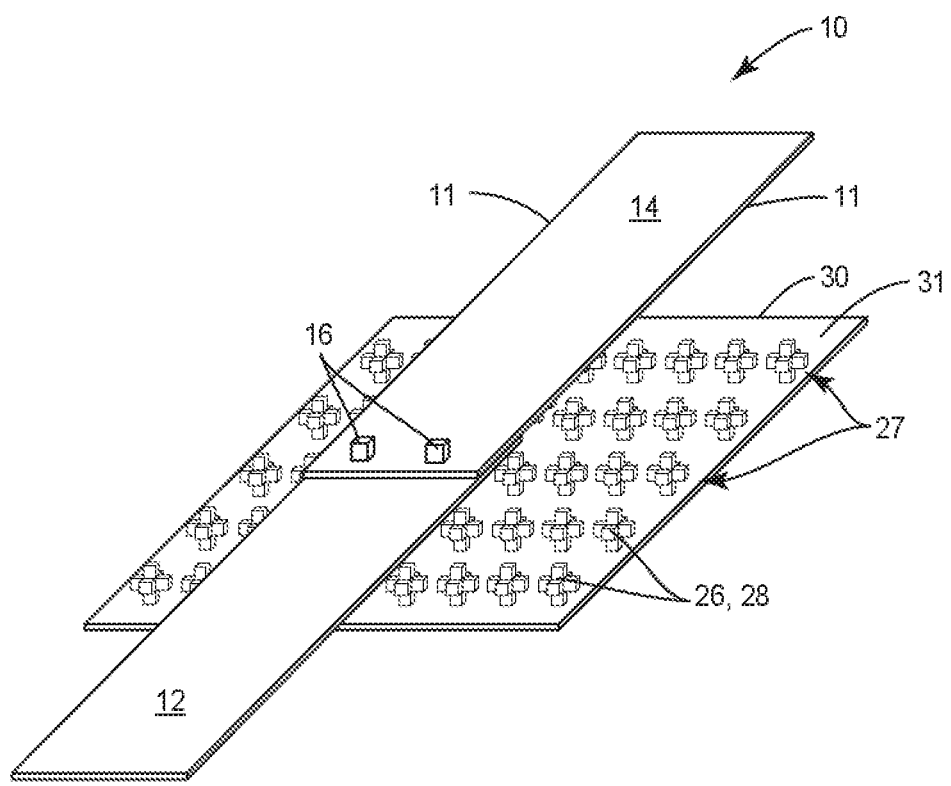
FIG. 5 is a perspective view of an array of magnetic field sensors proximate a test structure.

FIG. 5 depicts an array 30 on which a plurality of mounting structures 28 are affixed to a substrate 31. Each mounting structure 28 defines a sensor location 27. At least one magnetic field sensor 26, such as a B-dot coil, is positioned at each sensor location 27. The plurality of magnetic field sensors 26 is positioned proximate to a target surface 18, 24, such as one side of the test structure 10 (note that in the orientation of the test structure 10 in FIG. 5, the target surface 18, 24 faces the array 30 and is not visible). In a preferred aspect, the array 30 of magnetic field sensors 26 extends at least several coils 26 past each relevant edge 11 of the test structure 10. This ensures that field behavior at the edges 11 of the test structure 10 is captured. In particular, by placing B-dot coils 26 past the edges 11 of the test structure 10, magnetic field behavior at the edges 11 may be derived by interpolation, as described below. In one aspect, one or more indexing features, such as a clip (not shown), ensures repeatability in positioning the array 30 proximate to a target surface 18, 24. This aids the calibration process by ensuring consistent physical positioning (e.g. variations in X-Y location, rotation/tilt, etc.). Although calibration procedures, described further herein, can correct for variations in array 30 placement and orientation, consistent positioning of the array 30 is still advantageous.

Figure 6A:
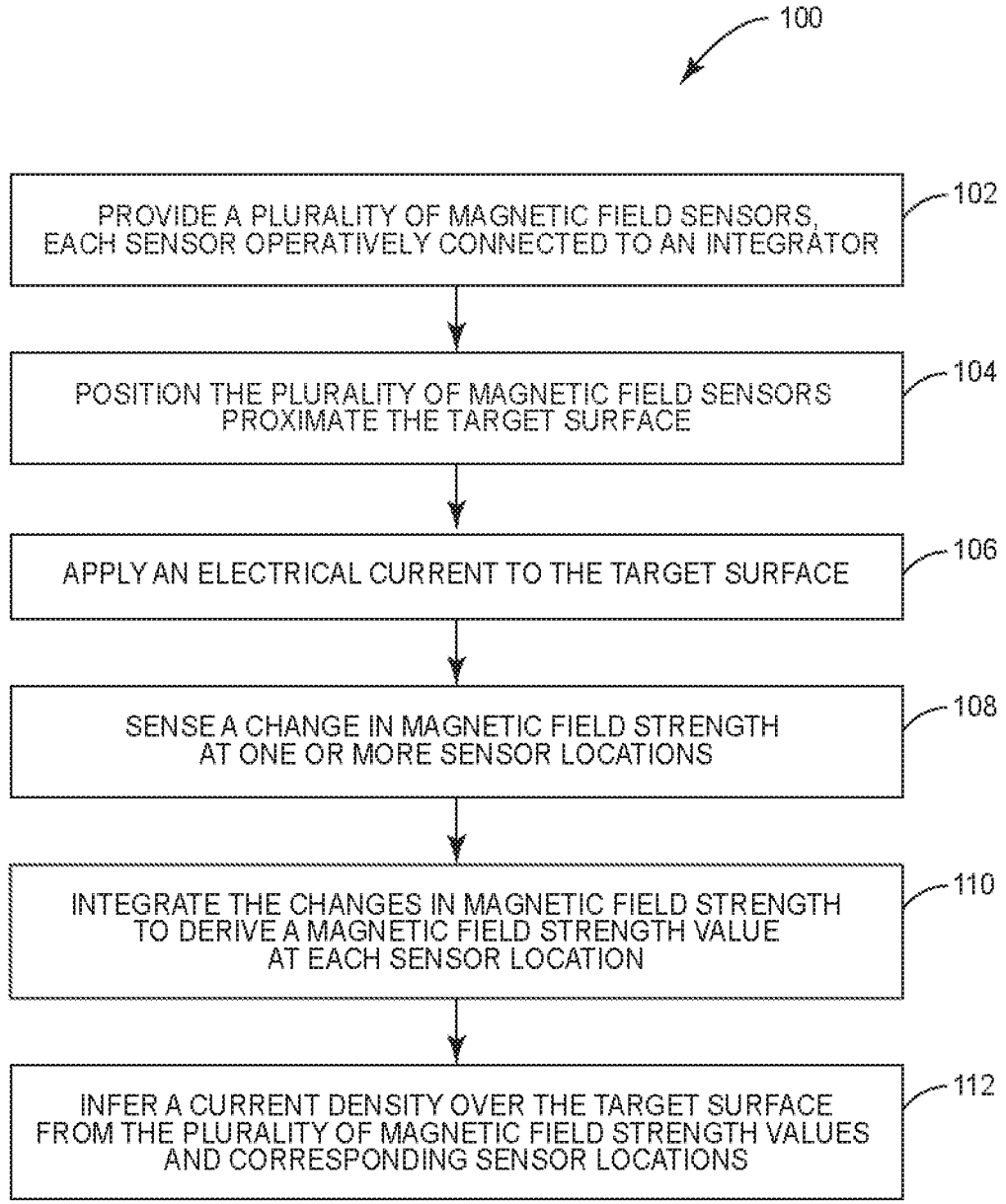
FIG. 6A is a flow diagram of a method of analyzing an electrical current over a target surface.

FIG. 6A depicts the steps of a method 100 of analyzing an electrical current over a target surface. A plurality of magnetic field sensors 26, preferably arranged in an array 30, is provided (block 102). Each sensor 26 is operatively connected to an integrator 32. The plurality of magnetic field sensors 26 is positioned proximate the target surface 18, 24 (block 104), and an electrical current is applied to the target surface 18, 24 (block 106), as depicted in FIG. 2. A change in magnetic field strength is sensed at one or more sensor locations 27 (block 108). The changes in magnetic field strength are integrated to derive a magnetic field strength value at each sensor location 27 (block 110). A current density over the target surface 18, 24 is inferred from the plurality of magnetic field strength values and corresponding sensor locations 27 (block 112).

Figure 6B:
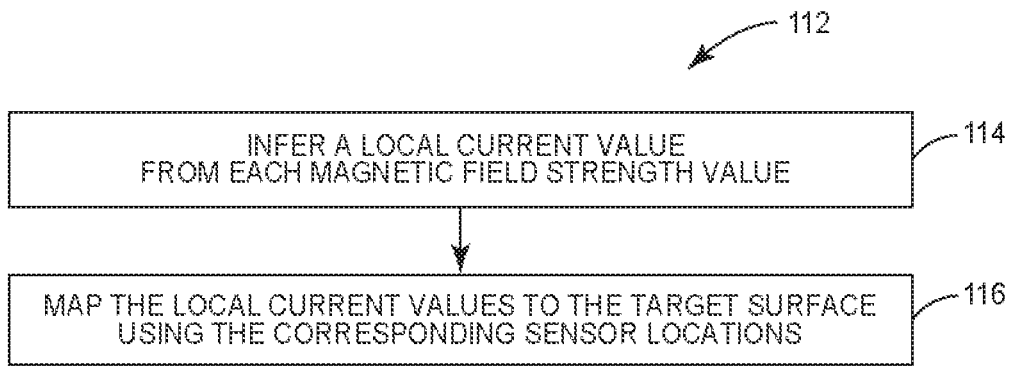
FIG. 6B is a flow diagram detailing a step of the method of FIG. 6A.

FIG. 6B depicts, in greater detail, steps taken according to one aspect to implement block 112 of FIG. 6A—inferring a current density over the target surface 18, 24 from the plurality of magnetic field strength values and corresponding sensor locations 27. These steps include first inferring a local current value from each magnetic field strength value (block 114), and then mapping the local current values to the target surface 18, 24 using the corresponding sensor locations 27 (block 116).

Figure 6C:
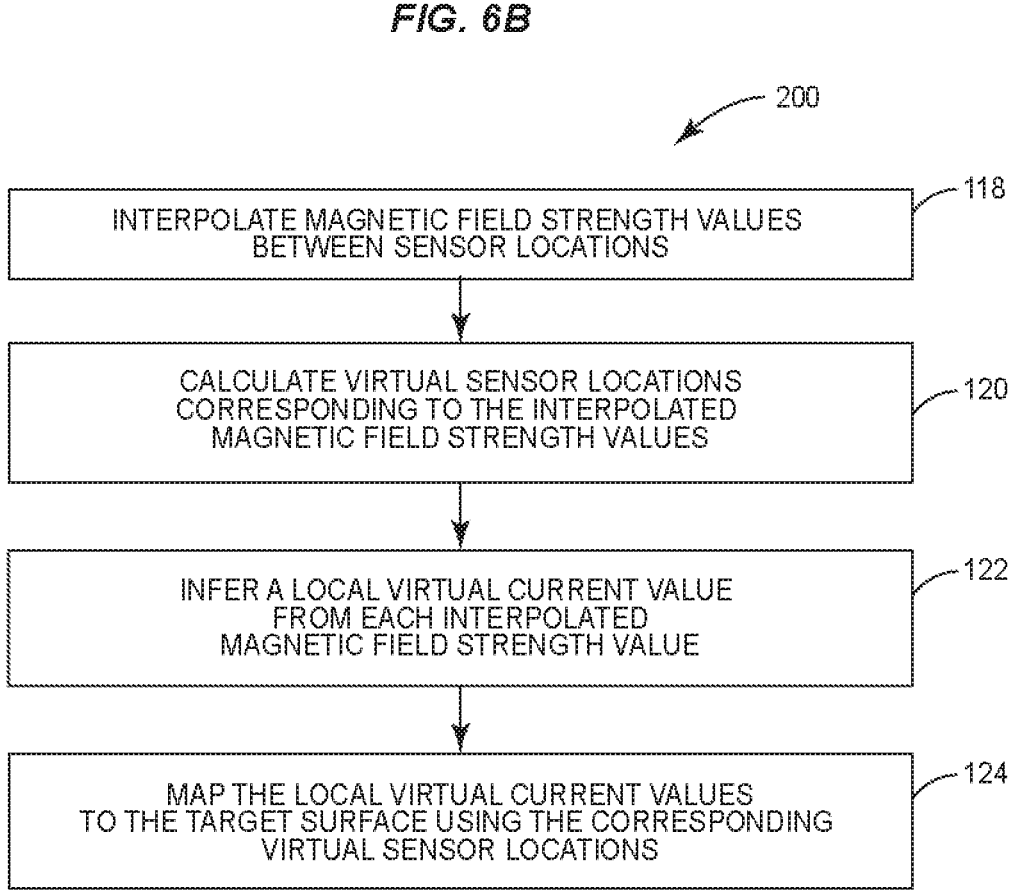
FIG. 6C is a flow diagram of a method of obtaining a higher resolution view of current density over a target surface.

FIG. 6C depicts the steps of a method 200 of obtaining a higher resolution view of current density over the target surface 18, 24. First, magnetic field strength values are interpolated between sensor locations 27 (block 118). Corresponding virtual sensor locations, corresponding to the interpolated magnetic field strength values, are calculated (block 120). A local virtual current value is inferred from each interpolated magnetic field strength value (block 122). The local virtual current values are then mapped to the target surface 18, 24 using the corresponding virtual sensor locations (block 124).

Figure 7:
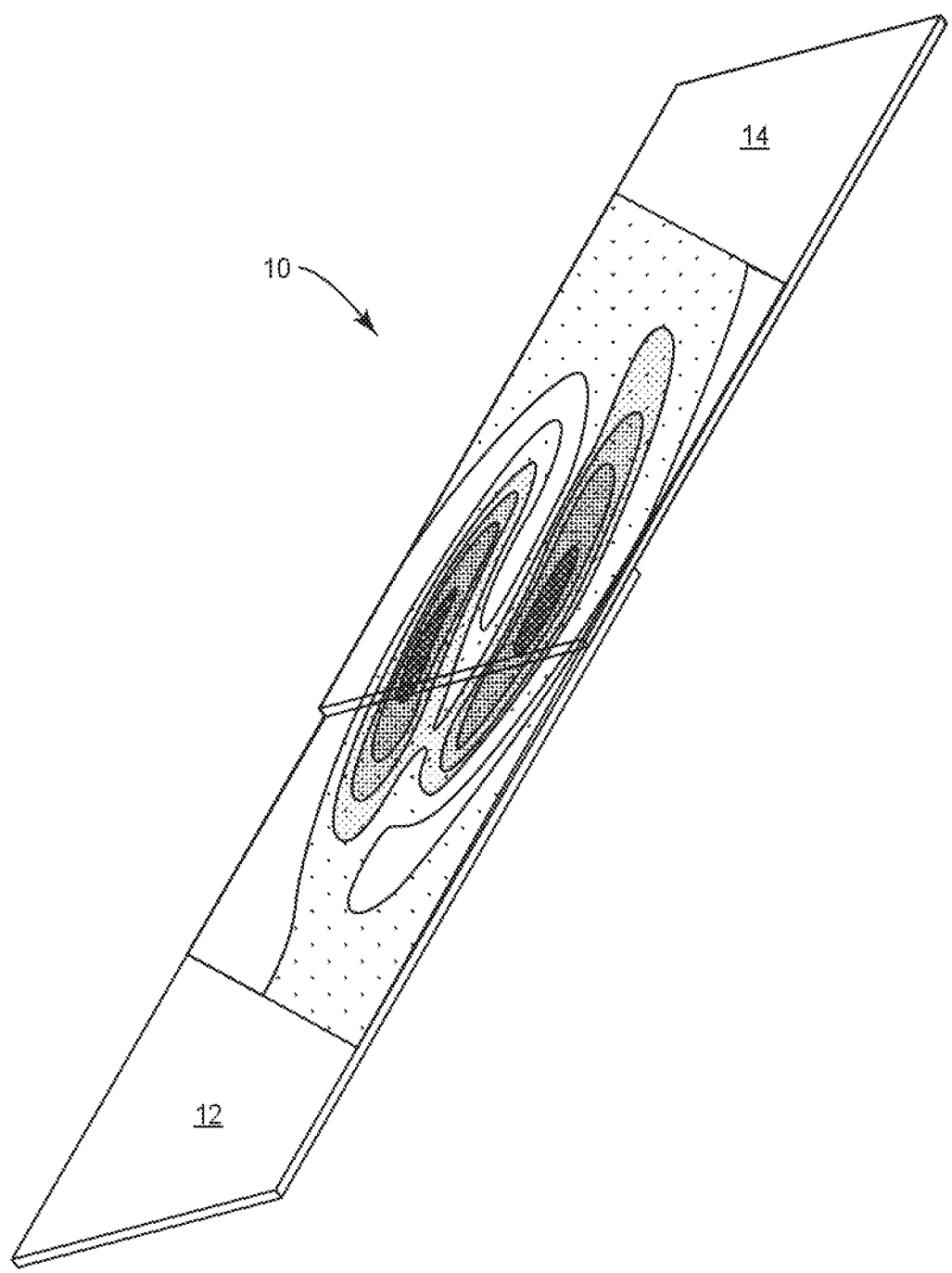
FIG. 7 is a 2-D plot depicting current density over the test surface.

FIG. 7 depicts a current density plot overlaid on the test structure 10. The current density plot results from integrating and post-processing the magnetic field sensor 26 outputs (and optionally interpolating between sensors 26), to infer a current density. As anticipated, current is concentrated in the fasteners 16, but is distributed around them in an unpredictable manner.

Figure 6D:
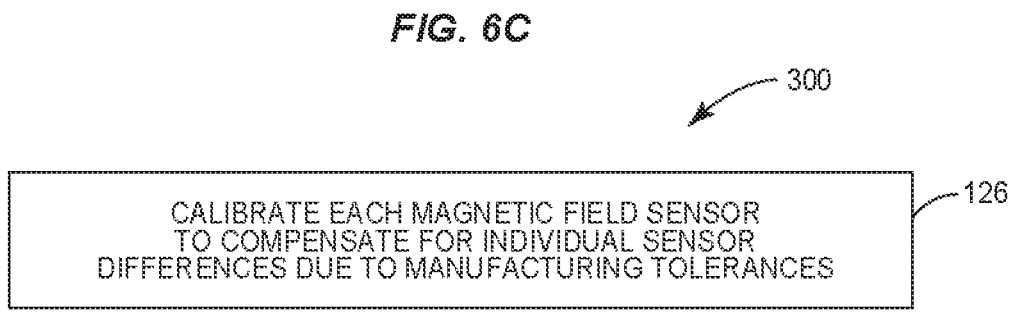
FIG. 6D is a flow diagram of a method of calibrating individual magnetic field sensors.

For several reasons, B-dot coils 26 must be calibrated to achieve accurate field measurements. Since the coils 26 tend to be small, physical measurements of the coil area may be inaccurate. Normal manufacturing tolerances will result in coil-to-coil differences in some parameters, such as the number of (partial) turns, the coil surface area, and the like. In addition, non-ideal electronic effects take place, especially involving the self-inductance of the coil 26 or the cabling. Calibration may be accomplished, for example, by applying a known sinusoidal magnetic field, such as from a Helmholtz coil driven by a signal generator, and determining the amplitude of coil response as a function of frequency using an oscilloscope. Alternatively, a network analyzer can be used, which simplifies data collection and allows the phase of the probe's response to be determined as well. Those of skill in the art will recognize that such calibration is routine for measuring equipment, and may devise any number of adequate calibration procedures, given the teachings of the present disclosure. FIG. 6D depicts the step of a method 300 of calibrating each magnetic field sensor to compensate for individual sensor differences due to manufacturing tolerances (block 126).

Apart from calibrating individual B-dot coils 26, the array 30 holding a plurality of coils 26 must also be calibrated. Referring to FIG. 2, assuming the array 30 of B-dot coils 26 is flat, it is apparent that the coils 26 positioned over the sheet 12 are closer to the surface 18 than the coils 26 positioned over the sheet 14 are to the surface 24, due to the offset of the two sheets 12, 14. Accordingly, all of the coils 26 positioned over the sheet 14 will register a lower intensity magnetic field. This difference in distance of each coil 26 from the target surface 18, 24 must be accounted for in order to obtain an accurate measurement of the magnetic field, from which current over the target surface 18, 24 is inferred. Under the assumption that the distance from each coil 26 to the target surface 18, 24 is much smaller than the extent of the target surface 18, 24, then the target surface 18, 24 may be modeled as an infinite current sheet, for which the magnetic field strength is:

$$B = \frac{\mu_0 \cdot i}{2\pi r}$$

where $\mu_0$ is the permeability of air and r is the distance of the coil 26 from the target surface 18, 24.

Figure 8:
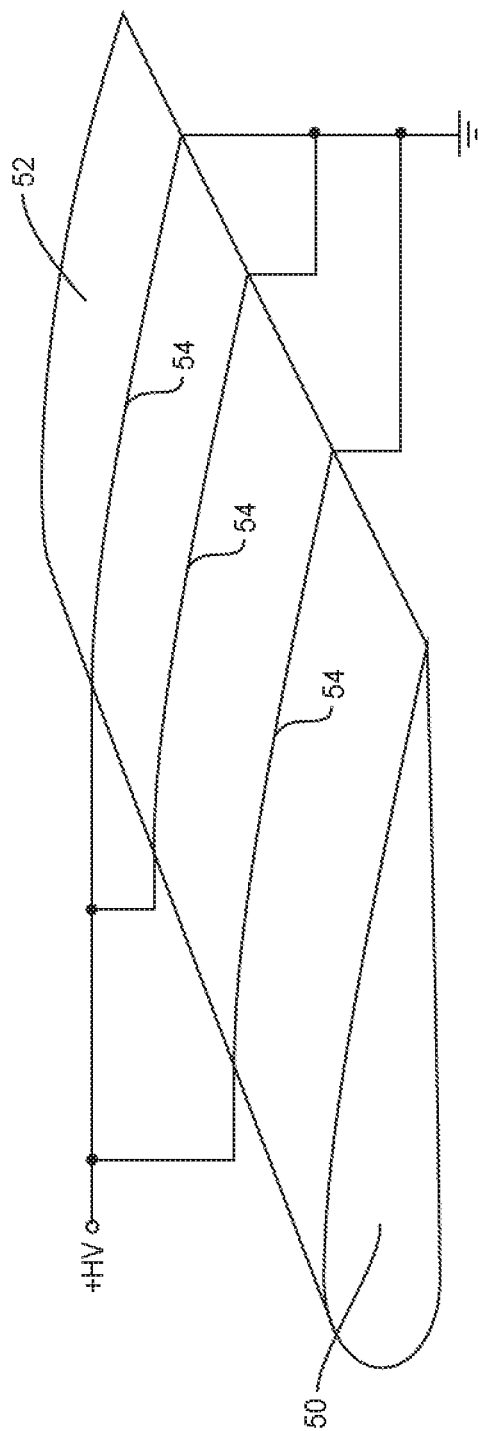
FIG. 8 is a perspective view of a calibration test structure providing a proxy surface.

In one aspect, an array 30 of magnetic field sensors 26 is calibrated by use of a proxy surface. FIG. 8 depicts a calibration test structure 50, presenting a proxy surface 52 having the geometry (e.g., the shape or form) of a target surface, such as an airplane wing. The calibration test structure 50, and hence proxy surface 52, is formed of a dielectric material, and includes one or more conductors 54. The conductors 54 are connected to a high voltage source (+HV), and current is directed through the conductors 54, generating magnetic fields around them.

Figure 9:
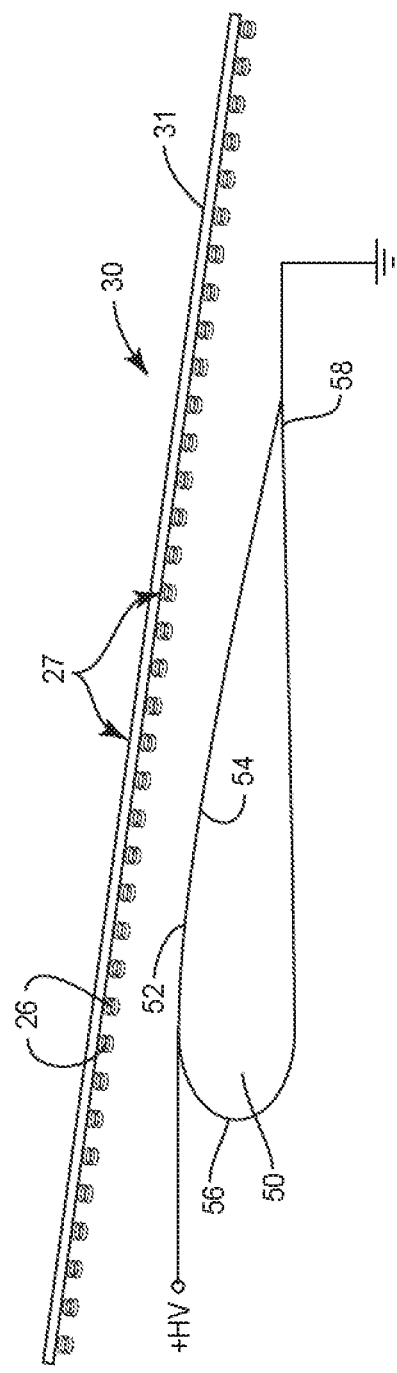
FIG. 9 is a section view of the calibration test structure and a sensor array.

FIG. 9 depicts a cross-section view of the calibration test structure 50, with the section line taken at a conductor 54 lying along, or embedded within, the proxy surface 52. FIG. 9 also depicts an array 30 of magnetic field sensors 26. As described above with respect to FIG. 2, it is apparent that there are varying distances between different magnetic field sensors 26 and corresponding points on the proxy surface. A calibration procedure is described to compensate for these different distances.

Figure 6E:
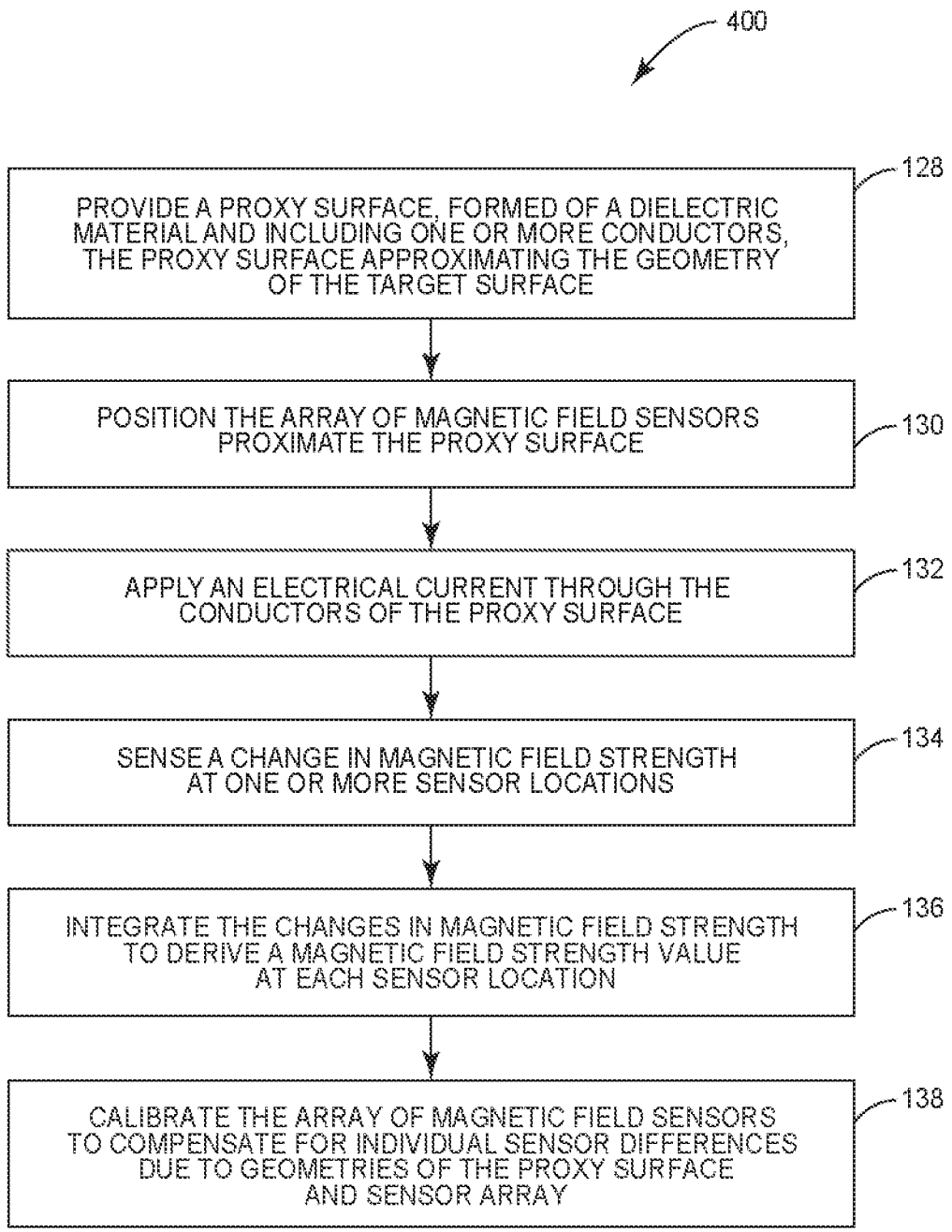
FIG. 6E is a flow diagram of a method of calibrating an array of magnetic field sensors using a proxy surface.

FIG. 6E depicts a method 400 of calibrating a plurality of magnetic field sensors 26 positioned in a fixed array 30. The proxy surface 52 is provided, as described above (block 128). The proxy surface 52 is formed of a dielectric material, includes one or more conductors 54, and approximates the geometry of a target surface, such as an aircraft wing. An array 30 of magnetic field sensors 26 is positioned proximate the proxy surface 52 (block 130), and an electrical current is applied through the conductors 54 (block 132). Note that, as described above, the array 30 of magnetic field sensors 26 extends past the leading edge 56 and trailing edge 58 of the proxy surface 52. A plurality of magnetic field sensors 26 each senses a change in magnetic field strength at its respective sensor location 27 (block 134). The changes in magnetic field strength are integrated to derive a magnetic field strength value at each sensor location 27 (block 136). The outputs of the array 30 of magnetic field sensors 26 are calibrated to compensate for individual sensor 26 differences due to differing geometries between the proxy surface 52 and sensor array 30 (block 138).

Figure 10:
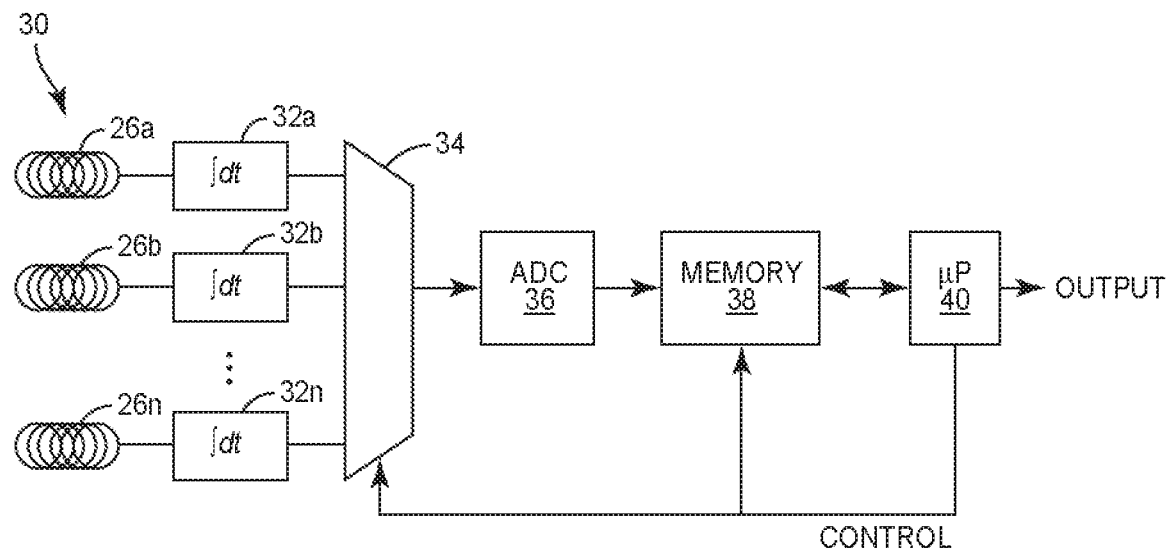
FIG. 10 is a block diagram of an electronics system for magnetic field sensors.
Figure 11:
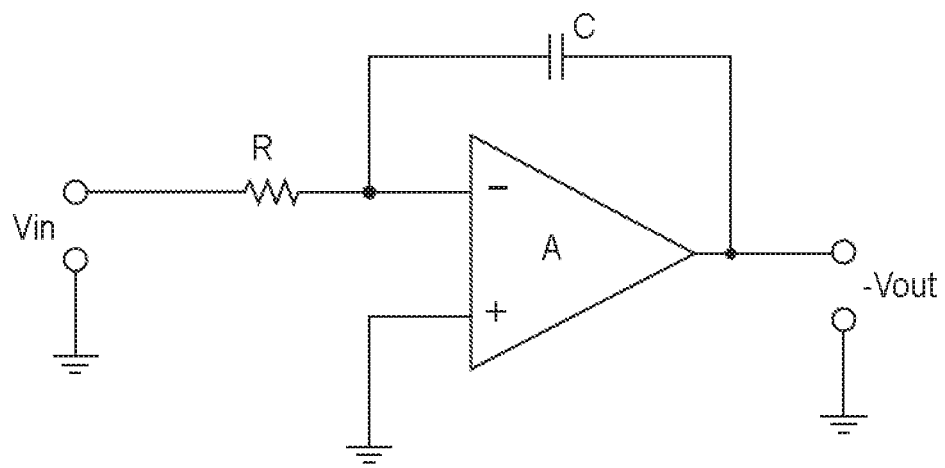
FIG. 11 is a schematic diagram of an active integrator circuit.

FIG. 10 depicts a simplified view of one aspect of the electronics for an array 30 of magnetic field sensors 26. Each magnetic field sensor 26a, 26b, . . . 26n is connected to a corresponding integrator 32a, 32b, . . . 32n. Each integrator 32 may comprise an analog circuit, such as an operational amplifier A together with an RC circuit, as depicted in FIG. 11. Alternatively, the output of each magnetic field sensor 26 may be digitized, and the integration performed by a Digital Signal Processor (DSP). In either case, the integrators 32 are preferably of high quality, with droop correction and high sensitivity. In the representative system of FIG. 8, the outputs of the integrators 32 are consecutively (or in any predetermined order) multiplexed by switching unit 34 into an Analog to Digital Converter (ADC) 36. The digital data are stored in a non-transitory computer readable medium, such as memory 38 (e.g., RAM, ROM, Flash, SSD, HDD, magnetic tape, etc.). A controller 40, such as a microprocessor or DSP, then accesses the stored data to perform calibration calculations, calculate the local current values, map the local current values to sensor locations 27, and generate a model or view of the current density over the target surface 18, 24. The current density over the target surface 18, 24 may be output, e.g., to a display, printer, or the like. The controller 40 may also control operation of the system components. Those of skill in the art will readily recognize that separate controllers 40 may each perform part of the computational load, such as one controller 40 controlling the system components and another controller 40 calculating current density.

Technical effects of the systems and methods described herein include at least one of i) providing a plurality of magnetic field sensors, each sensor operatively connected to an integrator; ii) positioning the plurality of magnetic field sensors proximate a target surface; iii) applying an electrical current to the target surface; iv) sensing a change in magnetic field strength at one or more sensor locations; v) integrating the changes in magnetic field strength to derive a magnetic field strength value at each sensor location; and vi) inferring a current density over the target surface from the plurality of magnetic field strength values and corresponding sensor locations.

Aspects of the present invention provide numerous advantages over the prior art. There is currently no way to accurately measure real-world current over large surfaces. The need for this ability is particularly acute, for example to model and study the effects of lightning strikes, as aircraft wings and fuselages evolve from metal to composite construction.

The present invention may, of course, be carried out in other ways than those specifically set forth herein without departing from essential characteristics of the invention. The present aspects are to be considered in all respects as illustrative and not restrictive, and all changes coming within the meaning and equivalency range of the appended claims are intended to be embraced therein.

What is claimed is:

1. A method of analyzing an electrical current over a target surface, comprising:
   providing a plurality of magnetic field sensors, each sensor operatively connected to an integrator;
   positioning the plurality of magnetic field sensors proximate the target surface;
   applying an electrical current to the target surface;
   sensing a change in magnetic field strength at one or more sensor locations;
   integrating the changes in magnetic field strength to derive a magnetic field strength value at each sensor location;
   inferring a current density over the target surface from the plurality of magnetic field strength values and corresponding sensor locations;
   interpolating magnetic field strength values between sensor locations;
   calculating virtual sensor locations corresponding to the interpolated magnetic field strength values;
   inferring a local virtual current value from each interpolated magnetic field strength value; and
   mapping the local virtual current values to the target surface using the corresponding virtual sensor locations.

2. The method of claim 1 wherein inferring a current density over the target surface comprises inferring a local current value from each magnetic field strength value, and mapping the local current values to the target surface using the corresponding sensor locations.

3. The method of claim 1 further comprising, prior to sensing a change in magnetic field strength at one or more sensor locations, calibrating each magnetic field sensor to compensate for individual sensor differences due to manufacturing tolerances.

4. The method of claim 3 wherein the magnetic field sensors each comprise a wire coil, and wherein the manufacturing tolerances include at least one of the type of wire in the coil, the number of turns of wire in the coil, and the area of the coil.

5. The method of claim 1 wherein the plurality of magnetic field sensors is positioned in a fixed array, and further comprising, prior to sensing a change in magnetic field strength at one or more sensor locations, calibrating the plurality of magnetic field sensors by:
   providing a proxy surface, formed of a dielectric material and including one or more conductors, the proxy surface approximating the geometry of the target surface;
   positioning the array of magnetic field sensors proximate the proxy surface;
   applying an electrical current through the conductors of the proxy surface;
   sensing a change in magnetic field strength at one or more sensor locations;
   integrating the changes in magnetic field strength to derive a magnetic field strength value at each sensor location; and
   calibrating the array of magnetic field sensors to compensate for individual sensor differences due to geometries of the proxy surface and sensor array.

6. The method of claim 1 wherein one or more magnetic field sensors comprise two or more wire coils oriented to sense changes in magnetic field strength in different directions, and wherein deriving a magnetic field strength value at each sensor location further comprises deriving a resultant magnetic field strength and direction for each magnetic field sensor by combining magnetic field strength values of the two or more wire coils and the wire coil orientations.

7. The method of claim 6 wherein the wire coil orientation directions are orthogonal to each other.

8. The method of claim 7 wherein one or more magnetic field sensors comprise three wire coils oriented to sense changes in magnetic field strength in three orthogonal directions.

9. The method of claim 1 wherein one or more magnetic field sensors comprise two wire coils oriented along the same direction but oppositely wound, and wherein deriving a magnetic field strength value at each sensor location comprises deriving the magnetic field strength from a common mode of the two wire coils, wherein extraneous magnetic fields are rejected.

10. An apparatus operative to analyze an electrical current over a target surface, comprising:
   a plurality of magnetic field sensors positioned at known locations in an array, each magnetic field sensor operative to sense a change in magnetic field strength;
   an integrator operatively connected to each magnetic field sensor and operative to derive a magnetic field strength value by integrating the connected sensor's output; and
   a data processing system operative to:
      receive an output of each integrator,
      infer a current density over the target surface from the plurality of magnetic field strength values and corresponding sensor locations;
      interpolate magnetic field strength values between sensor locations;
      calculate virtual sensor locations corresponding to the interpolated magnetic field strength values;
      infer a local virtual current value from each interpolated magnetic field strength value; and
      map the local virtual current values to the target surface using the corresponding virtual sensor locations.

11. The apparatus of claim 10 wherein one or more magnetic field sensors comprise two or more wire coils oriented to sense changes in magnetic field strength in different directions, and wherein the data processing system is further operative to derive a resultant magnetic field strength and direction for each magnetic field sensor by combining magnetic field strength values of the two or more wire coils and the wire coil orientations.

12. The apparatus of claim 11 wherein the wire coil orientation directions are orthogonal to each other.

13. The apparatus of claim 12 wherein one or more magnetic field sensors comprise three wire coils oriented to sense changes in magnetic field strength in three orthogonal directions.

14. The apparatus of claim 11 wherein the array of magnetic field sensors comprises:
   a substrate; and
   a plurality of mounting members affixed to the substrate at the known magnetic field sensor locations, each mounting member comprising at least two extension members on which wire coils are wound to form magnetic field sensors,
   wherein the plurality of mounting members are affixed to the substrate such that corresponding extension members are oriented in the same direction.

15. The apparatus of claim 14 wherein the extension members comprise corresponding pairs of extension members oriented 180° apart; the pairs of coils are wound in opposite directions on each extension member of a pair, the integrator is further operative to derive a magnetic field strength value at each sensor location from a common mode of each pair of wire coils, and wherein extraneous magnetic fields are rejected.

16. The apparatus of claim 10 wherein the array is sufficiently larger than the target surface that when the array is positioned proximate the target surface, a subset of magnetic field sensors are positioned beyond the outer edges of the target surface.

17. A non-transitory computer-readable medium storing program instructions operative to cause a data processing system to process magnetic field sensor array outputs to analyze an electrical current over a target surface by performing the steps of:
   sensing a change in magnetic field strength at one or more sensor locations on the array, when the magnetic field sensor array is positioned proximate the target surface and an electrical current is applied to the target surface;
   integrating the changes in magnetic field strength to derive a magnetic field strength value at each sensor location; and
   inferring a local current value from each magnetic field strength value;
   inferring a current density over the target surface by mapping the local current values to the target surface using the corresponding sensor locations;
   interpolating magnetic field strength values between sensor locations;
   calculating virtual sensor locations corresponding to the interpolated magnetic field strength values;

inferring a local virtual current value from each interpolated magnetic field strength value; and generating a high-granularity current density over the target surface by additionally mapping the local virtual current values to the target surface using the corresponding virtual sensor locations.

18. The computer-readable medium of claim 17 wherein the program instructions are further operative to cause the data processing system to calibrate the magnetic field sensor array when the sensor array is positioned proximate a proxy surface formed of a dielectric material, including one or more conductors, and approximating the geometry of the target surface, and current flows through the conductors, by sensing a change in magnetic field strength at one or more sensor locations;

integrating the changes in magnetic field strength to derive a magnetic field strength value at each sensor location; and calibrating the array of magnetic field sensors to compensate for individual sensor differences due to geometries of the proxy surface and sensor array.

19. The non-transitory computer-readable medium of claim 17 wherein the program instructions are further operative to cause the data processing system to, prior to sensing a change in magnetic field strength at one or more sensor locations, calibrate each magnetic field sensor to compensate for individual sensor differences due to manufacturing tolerances.

20. The non-transitory computer-readable medium of claim 19 wherein the magnetic field sensors each comprise a wire coil, and wherein the manufacturing tolerances include at least one of the type of wire in the coil, the number of turns of wire in the coil, and the area of the coil.

* * * * *